United States Patent
Stein et al.

(10) Patent No.: US 9,183,079 B2
(45) Date of Patent: Nov. 10, 2015

(54) MULTI-LAYER ERROR CORRECTING CODING

(71) Applicants: Yosef Stein, Sharon, MA (US); Haim Primo, Ganei Tikva (IL)

(72) Inventors: Yosef Stein, Sharon, MA (US); Haim Primo, Ganei Tikva (IL)

(73) Assignee: ANALOG DEVICES GLOBAL, Hamilton (BM)

( * ) Notice: Subject to any disclaimer, the term of this patent is extended or adjusted under 35 U.S.C. 154(b) by 70 days.

(21) Appl. No.: 14/058,048

(22) Filed: Oct. 18, 2013

(65) Prior Publication Data
US 2015/0113359 A1   Apr. 23, 2015

(51) Int. Cl.
*H04L 1/00* (2006.01)
*G06F 11/10* (2006.01)

(52) U.S. Cl.
CPC ..................... *G06F 11/10* (2013.01)

(58) Field of Classification Search
CPC .................................................. H04L 1/0057
USPC ................................. 714/776, 758
See application file for complete search history.

(56) References Cited

U.S. PATENT DOCUMENTS

| | | | |
|---|---|---|---|
| 5,434,886 A | * | 7/1995 | Kazawa et al. ............... 375/262 |
| 8,232,888 B2 | * | 7/2012 | Frederick et al. .......... 340/686.1 |
| 2009/0044231 A1 | * | 2/2009 | Oh et al. ......................... 725/62 |

OTHER PUBLICATIONS

P. Koopman et al., "Cyclic Redundancy Code (CRC) Polynomial Selection for Embedded Networks," The International Conference on Dependable Systems and Networks (DSN-2004), Florence, Italy, Jun. 2004, 10 pages.

K. Gracie et al., "Performance of a Low-Complexity Turbo Decoder and its Implementation on a Low-Cost, 16-Bit Fixed-Point DSP," The 10th International Conference on Wireless Communications (Wireless 98), Calgary, Canada, Jul. 1998, 10 pages.

* cited by examiner

*Primary Examiner* — Fritz Alphonse
(74) *Attorney, Agent, or Firm* — Kenyon & Kenyon LLP

(57) ABSTRACT

A transmission system may include a transformer, an adder, an encoder, and a transmitter. The transformer may segment and transform a data packet into segments. The adder may add a check code to each of the segments. The encoder may encode error correction to each of the segments with the added check code. A receiving system may include a receiver, a decoder, a checker, and a selector decoder. The decoder may decode error correction in each of the encoded segments. The checker may check the check code of the error corrected segments. The selector decoder may select at least one of the valid segments based upon the check code and transform the selected segments into a data packet.

20 Claims, 6 Drawing Sheets

200

400

500

600

MULTI-LAYER ERROR CORRECTING CODING

BACKGROUND

In wired or wireless transmissions and receptions, the information being sent may become corrupted by errors caused by system or environmental factors. Thus, transceiver systems may incorporate the use of error correcting codes (ECC) to check and correct potential errors contained in the information (for example, data packets) received.

In wired transmission, data may be converted to electrical or optical signals, which may be transmitted along a transmission medium, such as a copper wire or a fiber optic cable. Such transmission mediums may be designed to reduce external interferences to the transmission signals, and to maintain the integrity of the transmission signals. In wireless transmission, data may be converted to electromagnetic or optical or sound signals, which may be transmitted with or without directionality, openly through the atmosphere, space, and terrestrial or water bodies. In other words, wireless transmission may take place through uncontrolled transmission medium.

Regardless of transmission mediums, there is a need to increase the efficiency of error correction in transceiver systems to reduce error rates and improve data integrity.

DETAILED DESCRIPTION

Figure 1:
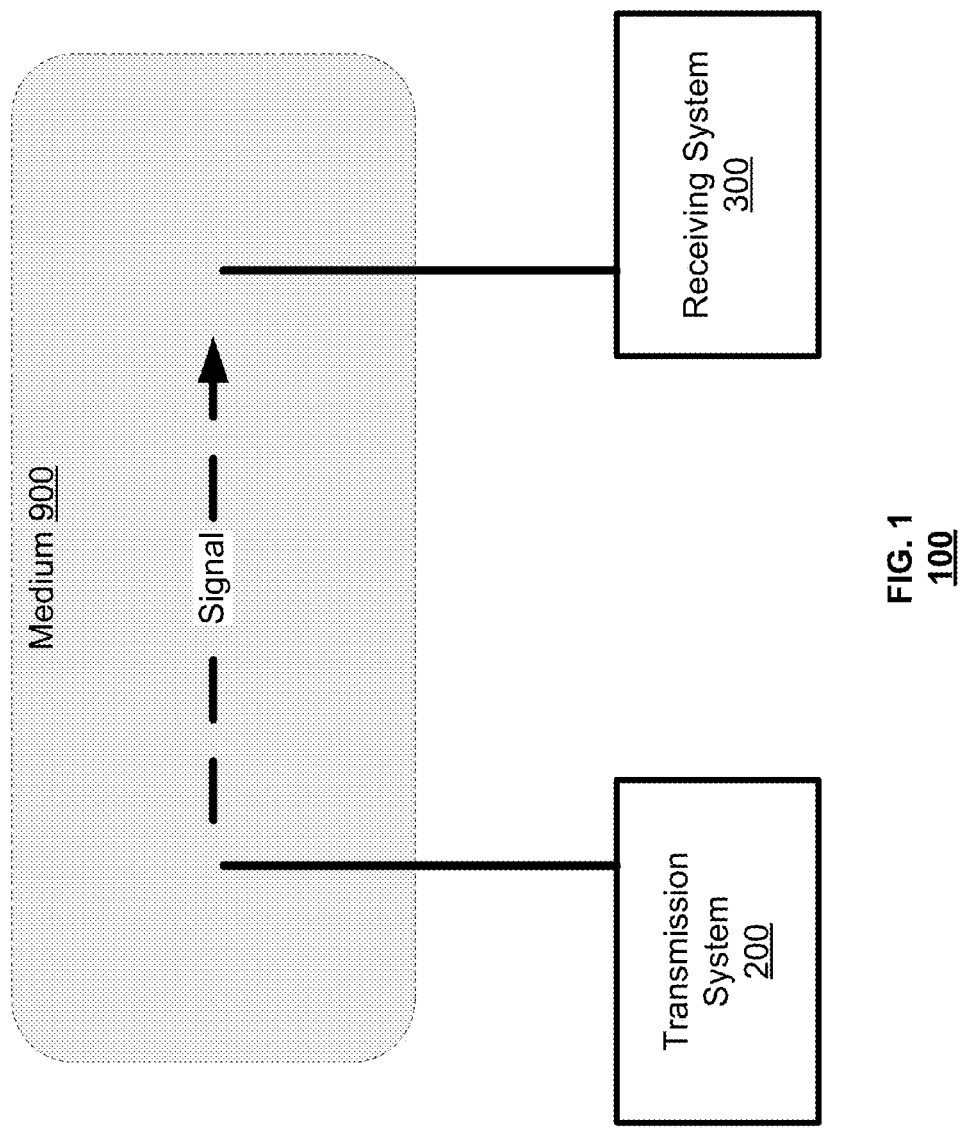
FIG. 1 is a simplified block diagram with a transmitting system and a receiving system.

FIG. 1 is a simplified block diagram with a transmitting system 200 and a receiving system 300, which send and receive information through a medium 900.

In wired transmission, data may be converted to electrical or optical signals, which may be transmitted along the transmission medium 900, such as a copper wire or a fiber optic cable. Such transmission mediums may be designed to reduce external interferences to the transmission signals, and to maintain the integrity of the transmission signals. In wireless transmission, data may be converted to electromagnetic or optical or sound signals, which may be transmitted with or without directionality, openly through the atmosphere, space, and terrestrial or water bodies. In other words, wireless transmission may take place through uncontrolled transmission medium 900.

The transmitting system 200 may transmit data and the receiving system 300 may receive data.

Figure 2:
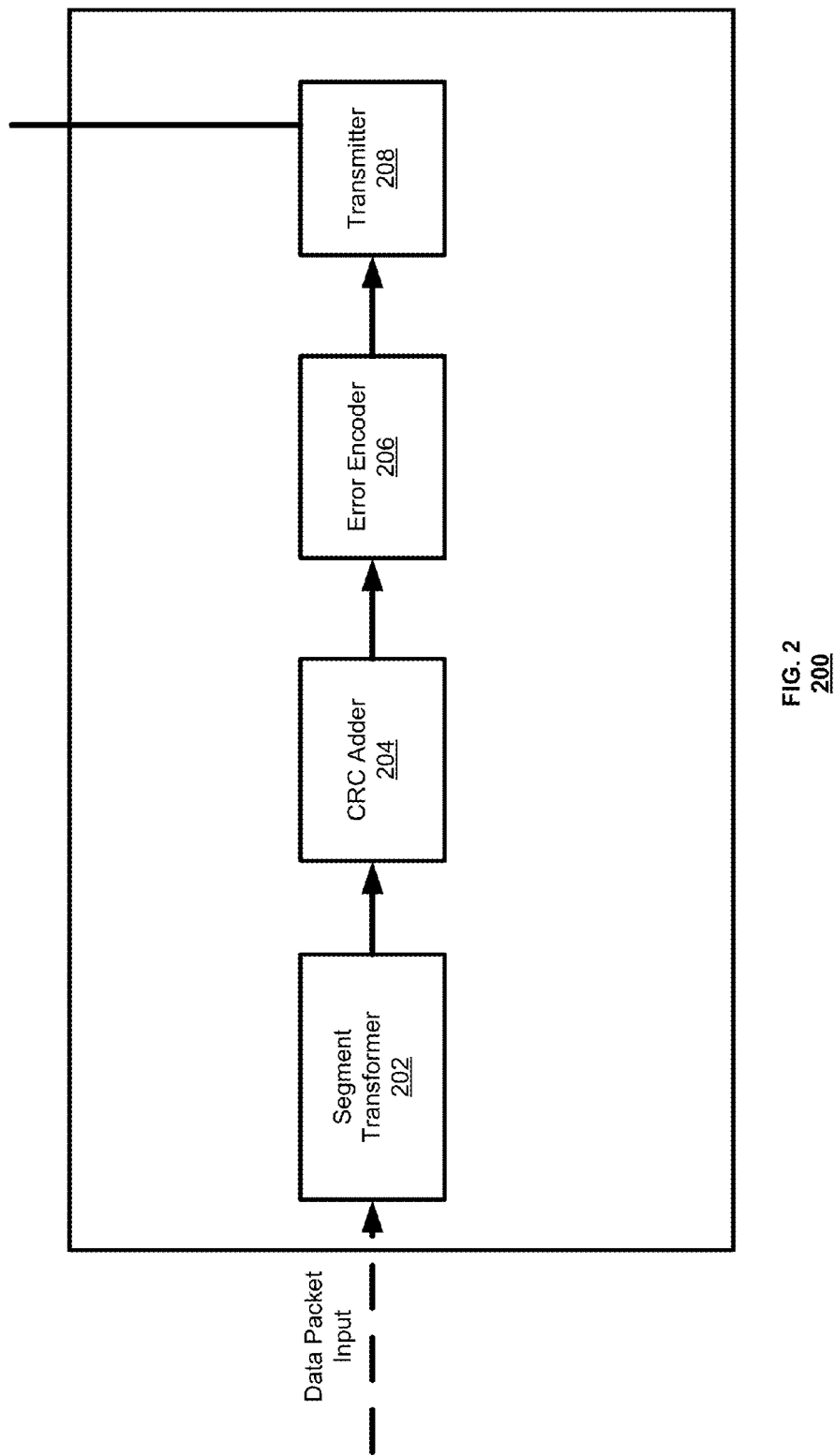
FIG. 2 illustrates an exemplary transmitting system according to an embodiment.

FIG. 2 illustrates an exemplary transmitting system 200 according to an embodiment.

The exemplary system 200 may include a segment transformer 202, a cyclic redundancy check (CRC) adder 204, an error encoder 206, and a transmitter 208. The segment transformer 202 may segment and transform a data packet into a plurality of segments. The CRC adder 204 may add a CRC to each of the plurality of segments. The error encoder 206 may encode error correction to each of the plurality of segments with the added CRC. The transmitter 208 may transmit the encoded plurality of segments.

According to an embodiment, the segment transformer 202 may separate a data packet into a plurality of segments, and transform each segment using a linear transform.

For example, a data packet of binary data for transmission may have a packet size of M=16 Bytes, defined as M bytes as $B(0), B(1), \ldots, B(M-1)$. The segment transformer may segment the data packet into M/L segments, where L is an integer greater than 2, i.e. 2, 3, 4 ….

For example, if L=2, the following segments W(k) may be generated:

$W(k)=[B(2*k)B(2*k+1)]\ k=0, 1, 2, \ldots, M/L-1.$

If L=3, the following segments W(k) may be generated:

$W(k)=[B(3*k)B(3*k+1)B(3*k+2)]\ k=0, 1, 2, \ldots M/L-1.$

For the transform, in one embodiment, $T(k)=C\{W(k)\}$ where C is conversion from bits representation to 2's complement format. A vector of unknowns (variable placeholder for each segment) may be defined as follows:

$x=[T(0)T(1)T(2) \ldots T(M/L-1)a(0)T(0)a(1)T(1) \ldots a(M/L-1)T(M/L-1)]^T,$ where x has a size of 2*M/L, where the coefficients of $A=[a(0)\ a(1) \ldots a(M/L-1)]$ may be selected positive integer numbers, such that the energy of the vector $A=[a(0)\ a(1)\ a(M/L-1)]$ may be minimal.

The segment transformer 202 may generate $H_x=y$, where H is a Hadamard matrix of size 2*M/L, and every set of M/L equations from the super set Hx=y are independent from each other, so that the M/L equations of Hx=y may be solvable to reverse-generate the M/L original segments. y may be the resulting segments generated by the segment transformer 202.

A Hadamard matrix may be defined by the following illustrative example.

Let H be a Hadamard matrix of order n. Then the partitioned matrix $$\begin{bmatrix} H & H \\ H & -H \end{bmatrix}$$

is a Hadamard matrix of order 2n.

Additionally, for example,
H of order 1, $H_1=[1]$ and
H of order 2, $$H_2 = \begin{bmatrix} 1 & 1 \\ 1 & -1 \end{bmatrix}.$$

There may be many options for choosing/selecting the A vector of coefficients. In one embodiment, A may be a set of prime numbers.

According to an embodiment, the CRC adder 204 may generate CRC code for each segment and add the CRC code as extra bits to each segment of y, for example as bits before or after each segment. CRC code may be chosen for system 200 based upon the size or the length of the data packet or the individual segments, to maximize error detection during error check.

According to an embodiment, the error encoder 206 may be a multi-channel forward error correction (FEC) encoder, such as a Turbo encoder or a Viterbi encoder or a low-density parity-check (LDPC) encoder. The error encoder 206 may perform the forward error correction encoding on the segments of y that contains the CRC coding. The error correction encoding may be linear or non-linear.

According to an embodiment, the transmitter 208 may modulate and transmit the encoded plurality of segments, using various possible communication methods and medium.

System 200 may include other components such as memory storage and controller to determine, calculate, and/or select a set of processing parameters, such as the A vector, the CRC coding parameters, the segment length L, and the error encoder parameters. System 200 may determine or calculate these parameters based upon the data packet, or may select the parameters from tables of possible parameter sets based upon the data packet. System 200 may also determine, calculate, and/or select the parameters based upon past error performance history, available processing resources, transmission bandwidth, user selections. System 200 may signal the parameters to a corresponding receiving system 300, to enable the receiving system 300 to decode and reverse generate the data packet using appropriate corresponding parameters.

In such embodiments as above, it is possible to increase the efficiency of error correction in transceiver systems to reduce error rates and improve data integrity.

Below illustrates the possible determination for CRC error check setting and benefits of improved error correction performance of the exemplary systems.

Assuming that the receiver of the decoding process knows whether an equation in above is erroneous without aid of CRC error check.

Assume that the bit growth per equation is $$K_g = \log_2\left(2\frac{M}{L}\right) = 1 + \log_2\left(\frac{M}{L}\right)$$

Then, for each equation, there may be L bytes+the growth of bits or $$N_{bits\_in\_Equation} = 8*L + K_g$$

An equation will be erroneous or invalid, if there is at least one erroneous bit. Thus, probability of erroneous equation, $P_{Equation\_Error} = 1 - p_e^{8L+K_g}$, where $p_e$ may be the Viterbi error probability curve, if the transceiver systems above uses Viterbi error encoding/decoding.

There may be an error for every event such that the total number of good equation may be less than M/L. In such case, probability of error in one data packet may be represented as $$P_{packet\_error} \sum_{n=0}^{\frac{M}{L}-1} \frac{\left(2*\frac{M}{L}\right)!}{\left(2*\frac{M}{L}-n\right)!n!} (1 - P_{Equation\_Error})^n P_{Equation\_Error}^{2*\frac{M}{L}-n}$$

From above, similar packet error probability may be obtained for transceiver system using Turbo error encoding/decoding for packet size of 128 bits. The results may be similar to the Viterbi case, except that at signal to noise ratio (SNR)>2, the packet error probability decreases rapidly. Additionally, the results from exemplary transceiver systems with Viterbi error encoding/decoding may be better than using Turbo error encoding/decoding alone in transceiver systems.

In case when CRC error checks are added in the transceiver systems, $K_{CRC}$ bits may be added to every equation in y and the probability of error for the equation may be represented as $$N_{bits\_in\_Equation} = 8*L + K_g + K_{CRC}.$$

An equation will be erroneous or invalid, if there is at least one erroneous bit. Thus, probability of erroneous equation, $P_{Equation\_Error} = 1 - p_e^{8L+K_g+K_{CRC}}$.

CRC error checks if an equation is valid or invalid. Because of the cyclic nature of CRC error check, there may be cases where there are enough errors in one segment that will "move" the segment value to another segment value to cause CRC error check to give a false valid, but this is still an error. The probability of this occurrence may depend on the Hamming Distance (HD) between two coded words/segment values.

This probability of non-detection of invalid equations by CRC may be represented as $P_{ud}$.

If an equation is error free, the CRC error check will declare that it is valid with probability of 100%.

Given 2*M/L equations in the exemplary transceiver systems, which may be represented as $E_0, E_1, E_2, E_3, E_4, \ldots E_{2M/L-1}$, errors may occur such that there are less than M/L valid equations. This may not depend on the CRC error check.

In some cases, there may be at least M/L valid equations, because the CRC error check gave some false valid results. Then the receiver system 300 may erroneously select M/L equations such that at least one equation contain errors that were not detected because of the Hamming distance (probability of at least one equation containing errors not detected represented as $P_{ud}$).

For example, given M/L=5, 2*M/L equations may be

| Eq | 0 | 1 | 2 | 3 | 4 | 5 | 6 | 7 | 8 | 9 |
|---|---|---|---|---|---|---|---|---|---|---|
| and may have status | G | B | G | B | B | G | G | G | B | G, | where G indicate good equation, and B indicate bad equation.

The CRC error check may determine the following results:

Results: V V V X V V V V V V.

Thus, equations 1, 4, and 8 may be false valids.)

The probability of such sequence may be $P_{Equation\_Error}^4 (1-P_{Equation\_Error})^6$ That is, for the 4 errors, there may be $2^4$ possible results for CRC error check. For each possible result, there may be M/L equations randomly selected from the 6+(# of false invalids) equations (here total of 9 equations to select from). Then, there may be $N_1$ good equations and $2*M/L-N_1$ bad equations.

Assume that 2 bad equations resulted in false invalids from CRC error check, the total number of selections of M/L equations may be represented as:

$$\frac{(N_1+2)!}{\left(N_1+2-\frac{M}{L}\right)!\left(\frac{M}{L}\right)!}$$

but there may be only $$\frac{(N_1)!}{\left(N_1-\frac{M}{L}\right)!\left(\frac{M}{L}\right)!}$$

good possible results, therefore $$\frac{(N_1+2)!}{\left(N_1+2-\frac{M}{L}\right)!\left(\frac{M}{L}\right)!} - \frac{(N_1)!}{\left(N_1-\frac{M}{L}\right)!\left(\frac{M}{L}\right)!}$$

may be the number of bad possible results.

The total probability for this event may be represented as $$\left[\frac{\left(2\frac{M}{L}-N_1\right)!}{2!\left(2\frac{M}{L}-N_1-2\right)!} \frac{\frac{(N_1+2)!}{\left(N_1+2-\frac{M}{L}\right)!\left(\frac{M}{L}\right)!} - \frac{(N_1)!}{\left(N_1-\frac{M}{L}\right)!\left(\frac{M}{L}\right)!}}{\frac{(N_1+2)!}{\left(N_1+2-\frac{M}{L}\right)!\left(\frac{M}{L}\right)!}} p_{ud}^2 (1-p_{ud})^{2\frac{M}{L}-N_1-2}\right] P_{z,N_1}$$

where $$P_{z,N_1} = \frac{\left(2\frac{M}{L}\right)!}{(N_1)!\left(2\frac{M}{L}-N_1\right)!} p_{Equation\_Error}^{2\frac{M}{L}-N_1}(1-p_{Equation\_Error})^{N_1}.$$

If there are m false valids, then the total probability above may be derived and represented as $$P_{CRC,m,N_1} = \frac{\left(2\frac{M}{L}-N_1\right)!}{m!\left(2\frac{M}{L}-N_1-m\right)!}$$

$$\frac{\frac{(N_1+m)!}{\left(N_1+m-\frac{M}{L}\right)!\left(\frac{M}{L}\right)!} - \frac{(N_1)!}{\left(N_1-\frac{M}{L}\right)!\left(\frac{M}{L}\right)!}}{\frac{(N_1+m)!}{\left(N_1+m-\frac{M}{L}\right)!\left(\frac{M}{L}\right)!}} p_{ud}^m (1-p_{ud})^{2\frac{M}{L}-N_1-m}$$

Then, the probability of packet error may be derived and represented as $$P_{packet\_error\_addition} = \sum_{N_1=\frac{M}{L}}^{2\frac{M}{L}} \sum_{m=1}^{2\frac{M}{L}-N_1} P_{CRC,m,N_1} P_{z,N_1} \text{ and}$$

$$P_{packet\_error} =$$

$$\sum_{n=0}^{\frac{M}{L}-1} \frac{\left(2*\frac{M}{L}\right)!}{\left(2*\frac{M}{L}-n\right)!n!}(1-P_{Equation\_Error})^n P_{Equation\_Error}^{2*\frac{M}{L}-n} +$$

$$\sum_{N_1=\frac{M}{L}}^{2\frac{M}{L}} \sum_{m=1}^{2\frac{M}{L}-N_1} P_{CRC,m,N_1} P_{z,N_1}$$

For some Hamming distance (HD), it may be simplified:

$$P_{ud} = \sum_{N_{HD}=1}^{8L+K_g+K_{CRC}} A_{N_{HD}} p_e^{N_{HD}} (1-p_e)^{8L+K_g+K_{CRC}-N_{HD}}$$

where $A_{N_{HD}}$ may represent the total number of words/data values for a specific size data segment with distance $N_{HD}$.

For large Hamming distance (HD) such as 6 and above, it may be simplified:

$$P_{ud} = A_5 p_e^5 (1-p_e)^{8L+K_g+K_{CRC}-5} + \ldots$$

For SNR of 2.5 dB and above, Pe may be assumed to be 1e-3, and hence Pud=~1e-15. $P_{CRC,m,N_1}$ thus may affect only in the cases where m=1 & 2 and in this cases still the $P_{CRC,m,N_1}$ would be small enough such that the results in FIG. 2 would not be changed According an embodiment, CRC coding may be chosen to be CRC 12 with polynomial of 0x8F8, which may yield $A_5$=1452, $A_6$=13258.

To further reduce the error probabilities, a CRC of 13 bits with polynomial 0x1909 may yield a minimal HD of 6 (see Table 1 below).

For a message (data segment) of 34 bits, the following values for $A_{N_{HD}}$ may be yielded.

TABLE 1

| Message size | Poly | A(HD = 2) | A(HD = 3) | A(HD = 4) | A(HD = 5) | A(HD = 6) | A(HD = 7) | A(HD = 8) |
|---|---|---|---|---|---|---|---|---|
| 34 | 0x1909 | 0 | 0 | 0 | 0 | 2856 | 0 | 76010 |

Assuming a 14 bits CRC with polynomial of 0x372B, for a message (data segment) of 34 bits, the following values for $A_{N_{HD}}$ may be yielded.

TABLE 2

| Message size | Poly | A(HD = 2) | A(HD = 3) | A(HD = 4) | A(HD = 5) | A(HD = 6) | A(HD = 7) | A(HD = 8) |
| --- | --- | --- | --- | --- | --- | --- | --- | --- |
| 34 | 0x372b | 0 | 0 | 0 | 0 | 1583 | 0 | 45914 |

As seen from above tables, specific CRC coding with specific polynomials may be chosen to reduce the values of $A_{N_{HD}}$, while keeping minimum Hamming Distance (HD) at 6, which in turn may improve the result to Pud=1e-15 at Pe=1e-3.

Thus, it may be possible to diminish the effect of the CRC false valids on the packet error probability.

Figure 3:
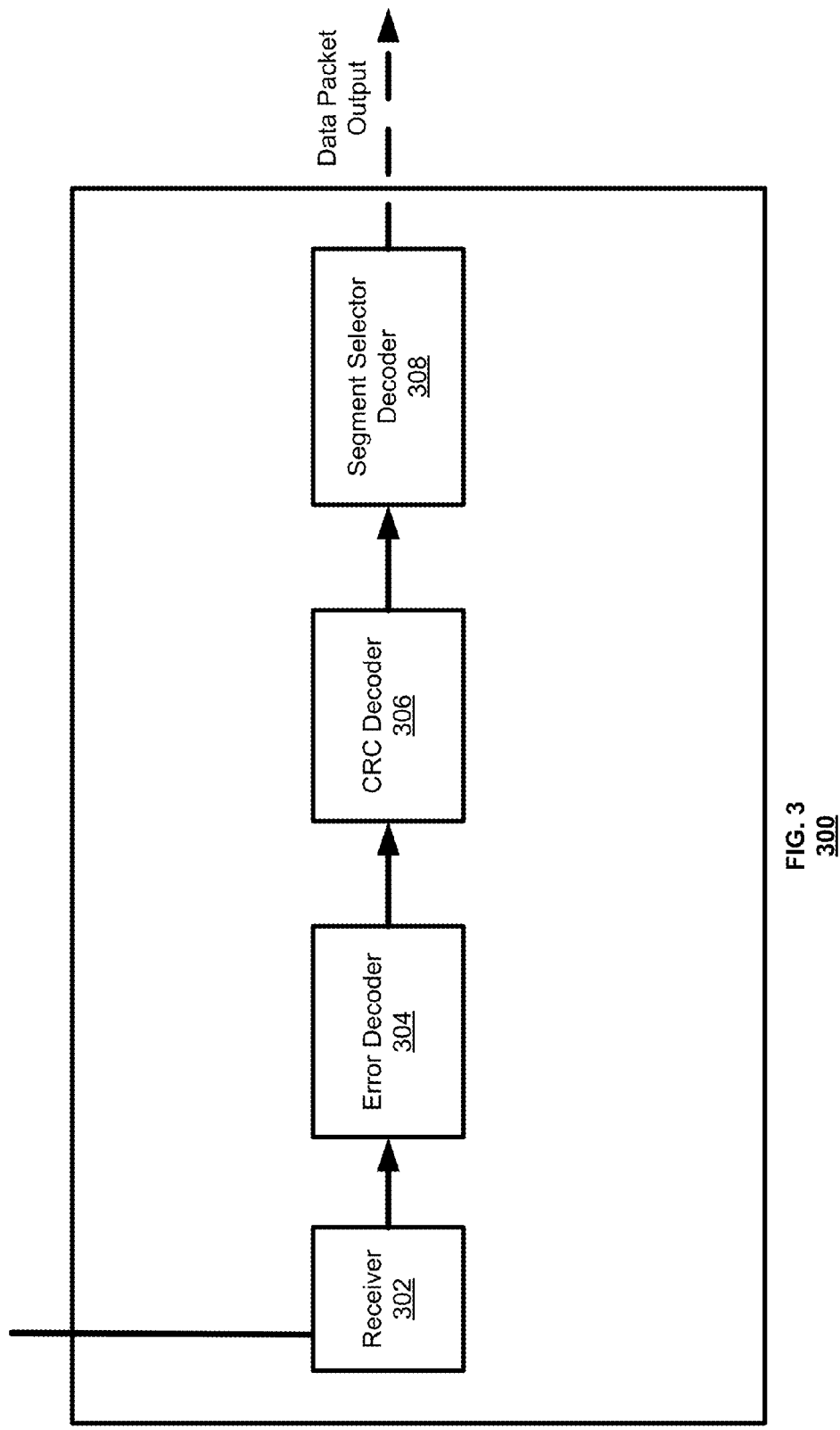
FIG. 3 illustrates an exemplary receiving system according to an embodiment.

FIG. 3 illustrates an exemplary receiving system 300 according to an embodiment.

The exemplary system 300 may include a receiver 302, an error decoder 304, a CRC decoder 306, and a segment selector decoder 308. The receiver 302 may receive an encoded plurality of segments. The error decoder 304 may decode error correction in each of the encoded plurality of segments. The CRC decoder 306 may decode CRC portion of the error corrected plurality of segments. The segment selector decoder 308 may select at least one of the segments based upon the CRC portion of the segments and transform the at least one segment into a data packet.

According to an embodiment, the receiver 302 may receive and demodulate signals to generate an encoded plurality of segments of data, using various possible communication methods and medium.

According to an embodiment, the error decoder 304 may be a forward error correction (FEC) decoder, such as a Turbo decoder or a Viterbi decoder or a low-density parity-check (LDPC) decoder. The error decoder 304 may perform the forward error correction decoding on segments of y data that contains CRC coding.

According to an embodiment, the CRC decoder 306 may perform CRC decoding or CRC error check for each segment and the CRC code of each segment of y, to determine which of the equations of Hx=y that are determined to be valid. The result of the error check may be sent to the segment selector decoder 308.

According to an embodiment, the segment selector decoder 308, based upon the error check result, may select at least M/L equations of Hx=y that are determined to be valid, and solve the selected valid equations to reverse-generate the M/L original segments. The segment selector decoder 308 may order and assemble the data packet from the solved M/L original segments.

If the system 300 determines, for example via the CRC decoder 306 and/or the segment selector decoder 308, that there are more than M/L valid equations of Hx=y, then the segment selector decoder 308 may randomly select only M/L valid equations out of more than M/L valid equations, and then solve for the M/L original segments.

If the system 300 determines, for example via the CRC decoder 306 and/or the segment selector decoder 308, that there are less than M/L valid equations of Hx=y, then the system 300 may indicate an error, and/or perform remedial measures such as signaling to transmission system 200 to retransmit, such as using automatic repeat request (ARQ).

Additionally, if the system 300 determines, for example via the CRC decoder 306 and/or the segment selector decoder 308, that there are more than M/L valid equations of Hx=y, it is still possible that some of the determined valid equations may be invalid (false valid equations) due to errors that cannot be detected from CRC error checking. If processing resources on system 300 are available, the system 300 may perform via the segment selector decoder 308 multiple sets of solving using multiple different sets of M/L valid equations of Hx=y, to verify whether the solutions from the multiple sets of solving agree with each other. The number of possible combinations forming the multiple sets of solving may be large, then random sample of a small number of different sets of M/L equations may be used to perform quick verification. If this verification determines that there may be at least one false valid equation, then the system 300 may indicate an error, and/or perform remedial measures such as signaling to transmission system 200 to retransmit, such as using automatic repeat request (ARQ).

In such embodiments as above, it is possible to increase the efficiency of error correction in transceiver systems to reduce error rates and improve data integrity.

Figure 4:
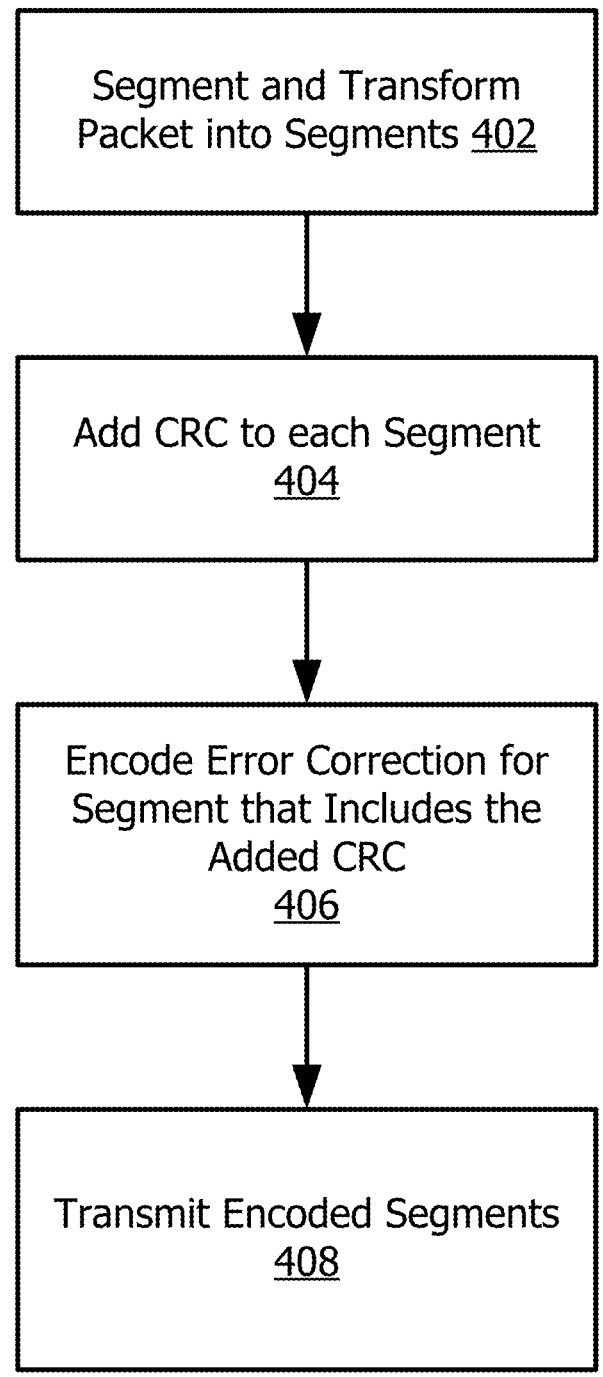
FIG. 4 illustrates an exemplary method according to an embodiment.

FIG. 4 illustrates an exemplary method 400 according to an embodiment.

At block 402, the segment transformer 202 may segment and transform a data packet into a plurality of segments.

At block 404, the CRC adder 204 may add a CRC to each of the plurality of segments.

At block 406, the error encoder 206 may encode error correction to each of the plurality of segments with the added CRC.

At block 408, the transmitter 208 may transmit the encoded plurality of segments.

Figure 6:
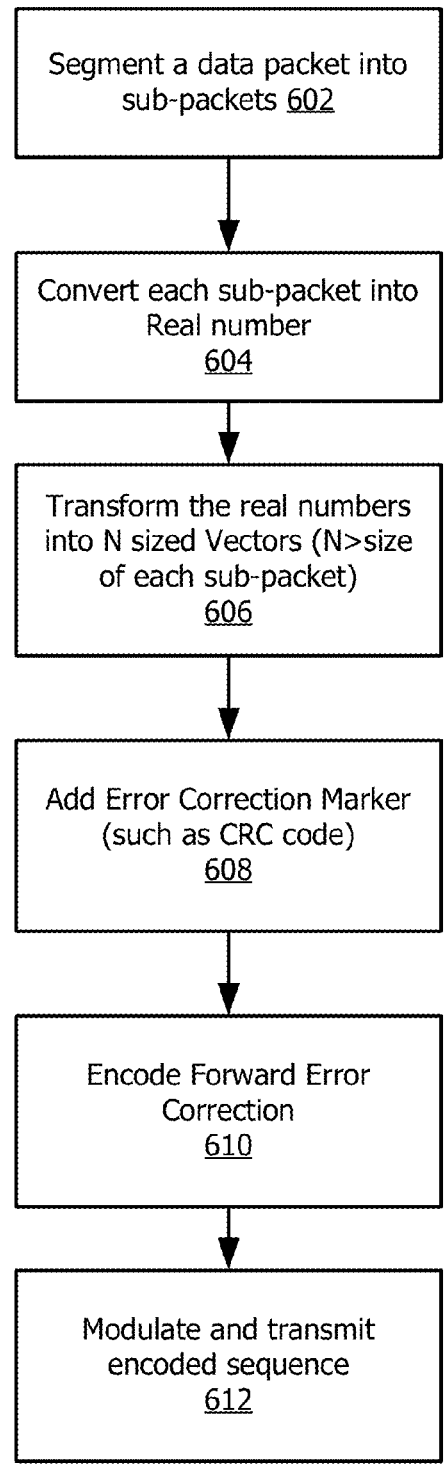
FIG. 6 illustrates an exemplary method according to an embodiment.

FIG. 6 illustrates an exemplary method 600, a detailed example of encoding method, according to an embodiment.

At block 602, the segment transformer 202 may segment or divide a data packet into M/L sub-packets.

At block 604, the segment transformer 202 may transform the M/L sub-packets into M/L real numbers, by for example, deriving the 2-compliment form of each sub-packet.

At block 606, the segment transformer 202 may transform the M/L real numbers into a N-sized vector, where N>M/L.

At block 608, the CRC adder 204 may add an error correction marker (such as CRC) to each element of the N-sized vector.

At block 610, the error encoder 206 may encode forward error correction to each element of the N-sized vector, where each element includes the error correction marker.

At block 612, the transmitter 208 may modulate and transmit the encoded sequence.

Figure 5:
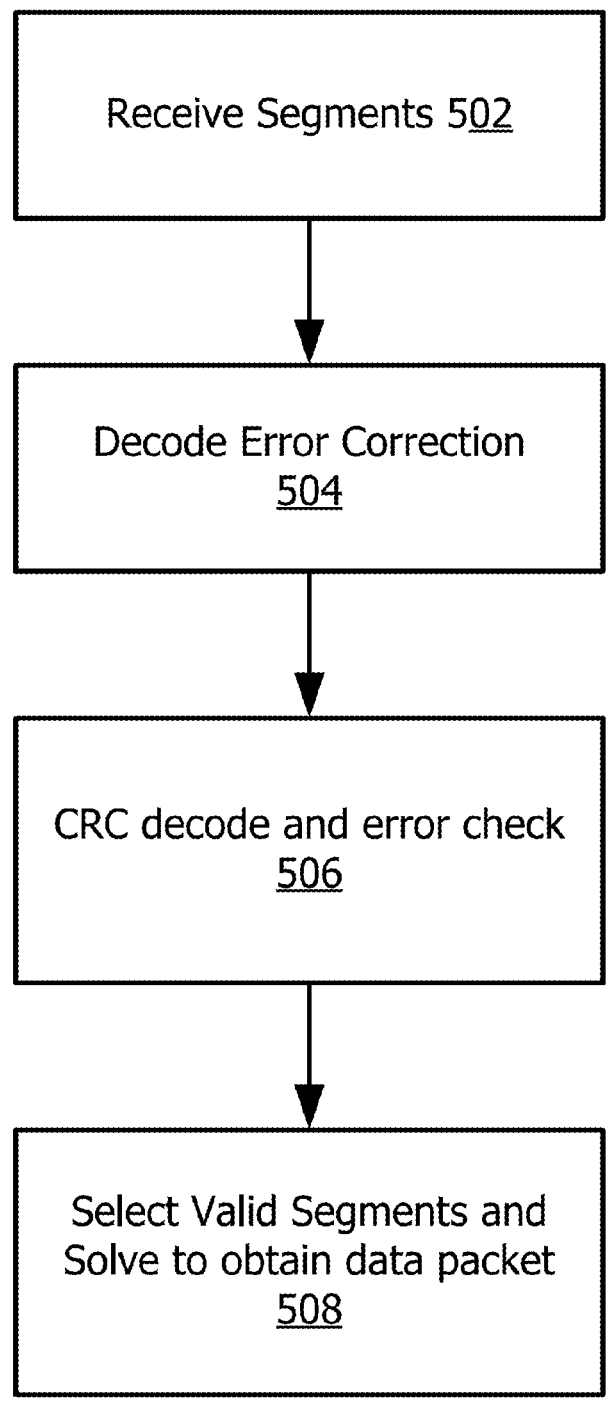
FIG. 5 illustrates an exemplary method according to an embodiment.

FIG. 5 illustrates an exemplary method 500 according to an embodiment.

At block 502, the receiver 302 may receive an encoded plurality of segments.

At block 504, the error decoder 304 may decode error correction in each of the encoded plurality of segments.

At block 506, the CRC decoder 306 may decode CRC portion of the error corrected plurality of segments.

At block 508, the segment selector decoder 308 may select at least one of the segments based upon the CRC portion of the segments and transform the at least one segment into a data packet.

It is appreciated that the disclosure is not limited to the described embodiments, and that any number of scenarios and embodiments in which conflicting appointments exist may be resolved.

Although the disclosure has been described with reference to several exemplary embodiments, it is understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular means, materials and embodiments, the disclosure is not intended to be limited to the particulars disclosed; rather the disclosure extends to all functionally equivalent structures, methods, and uses such as are within the scope of the appended claims.

While the computer-readable medium may be described as a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the embodiments disclosed herein.

The computer-readable medium may comprise a non-transitory computer-readable medium or media and/or comprise a transitory computer-readable medium or media. In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. Accordingly, the disclosure is considered to include any computer-readable medium or other equivalents and successor media, in which data or instructions may be stored.

Although the present application describes specific embodiments which may be implemented as code segments in computer-readable media, it is to be understood that dedicated hardware implementations, such as application specific integrated circuits, programmable logic arrays and other hardware devices, can be constructed to implement one or more of the embodiments described herein. Applications that may include the various embodiments set forth herein may broadly include a variety of electronic and computer systems. Accordingly, the present application may encompass software, firmware, and hardware implementations, or combinations thereof.

The present specification describes components and functions that may be implemented in particular embodiments with reference to particular standards and protocols, the disclosure is not limited to such standards and protocols. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "disclosure" merely for convenience and without intending to voluntarily limit the scope of this application to any particular disclosure or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

We claim:

1. A system, comprising:
a data packet segmenter dividing the data packets into sub-packets;
a converter converting each of the sub-packets into a real number representation in a respective sub-packet vector;
a transformer transforming the sub-packets vector into a real number vector with a dimension size that is greater than the dimension of the sub-packets vector;
an error detection marker adder adding an error detection marker to each real number vector; and
a forward error correction encoder encoding error correction to each real number vector.

2. The system of claim 1, wherein the transformer performs a linear transformation to transform each sub-packets vector with the dimension size of M into a real number vector with the dimension size of N, where N>M.

3. The system of claim 2, wherein the transformer transforms based upon a Hadamard matrix of size 2M (H(2M)) and a matrix C, to transform each sub-packets vector with the dimension size of M into a real number vector with the dimension size of N, where N=2M.

4. The system of claim 3, wherein the matrix C is a 2M×M matrix comprising two diagonal matrixes, wherein a first diagonal matrix has 1's on the diagonal elements and is M×M in size and placed on rows 1 to M of the matrix C, a second diagonal matrix comprises integer numbers.

5. The system of claim 4, wherein the integer numbers comprise prime numbers.

6. The system of claim 4, wherein the second diagonal matrix with the integer numbers have minimum energy, such that every set of M equations from a 2M equations of the matrix C is solvable.

7. The system of claim 4, wherein the integer numbers are selected such that the entropy would be minimized while every set of M equations from a 2M equations of the matrix C is solvable.

8. The system of claim 1, further comprising a transmitter transmitting a sequence of the real number vectors.

9. The system of claim 1, wherein the transformer segments the data packet into equal length segments of data.

10. The system of claim 1, wherein the forward error correction encoder is a Turbo encoder or a Viterbi encoder or a low-density parity-check (LDPC) encoder.

11. A method, comprising:
dividing, by a data packet segmenter, the data packets into sub-packets;
converting, by a converter, each of the sub-packets into a real number representation in a respective sub-packet vector;
transforming, by a transformer, the sub-packets vector into a real number vector with a dimension size that is greater than the dimension of the sub-packets vector;
adding, by an error detection marker adder, an error detection marker to each real number vector; and
encoding, by a forward error correction encoder, error correction to each real number vector.

12. The method of claim 11, wherein the transformer performs a linear transformation to transform each sub-packets vector with the dimension size of M into a real number vector with the dimension size of N, where N>M.

13. The method of claim 12, wherein the transformer transforms based upon a Hadamard matrix of size 2M (H(2M)) and a matrix C, to transform each sub-packets vector with the dimension size of M into a real number vector with the dimension size of N, where N=2M.

14. The method of claim 13, wherein the matrix C is a 2M×M matrix comprising two diagonal matrixes, wherein a first diagonal matrix has 1's on the diagonal elements and is M×M in size and placed on rows 1 to M of the matrix C, a second diagonal matrix comprises integer numbers.

15. The method of claim 14, wherein the integer numbers comprise prime numbers.

16. The method of claim 14, wherein the second diagonal matrix with the integer numbers have minimum energy, such that every set of M equations from a 2M equations of the matrix C is solvable.

17. The method of claim 14, wherein the integer numbers are selected such that the entropy would be minimized while every set of M equations from a 2M equations of the matrix C is solvable.

18. The method of claim 11, further comprising transmitting, by a transmitter, a sequence of the real number vectors.

19. The method of claim 11, wherein the transformer segments the data packet into equal length segments of data.

20. The method of claim 11, wherein the forward error correction encoder is a Turbo encoder or a Viterbi encoder or a low-density parity-check (LDPC) encoder.

* * * * *